US009459797B2

(12) United States Patent
Dimitrakopoulos et al.

(10) Patent No.: US 9,459,797 B2
(45) Date of Patent: Oct. 4, 2016

(54) UNIFORMLY DISTRIBUTED SELF-ASSEMBLED CONE-SHAPED PILLARS FOR HIGH EFFICIENCY SOLAR CELLS

(71) Applicant: GLOBALFOUNDRIES INC., Grand Cayman (KY)

(72) Inventors: Christos Dimitrakopoulos, Baldwin Place, NY (US); Augustin J. Hong, White Plains, NY (US); Jeehwan Kim, White Plains, NY (US); Devendra K. Sadana, Pleasantville, NY (US); Kuen-Ting Shiu, White Plains, NY (US)

(73) Assignee: GLOBALFOUNDRIES, INC, Grand Cayman (KY)

( * ) Notice: Subject to any disclaimer, the term of this patent is extended or adjusted under 35 U.S.C. 154(b) by 0 days.

(21) Appl. No.: 14/153,728

(22) Filed: Jan. 13, 2014

(65) Prior Publication Data

US 2014/0124033 A1    May 8, 2014

Related U.S. Application Data

(62) Division of application No. 13/161,163, filed on Jun. 15, 2011, now Pat. No. 8,628,996.

(51) Int. Cl.
*H01L 31/02* (2006.01)
*G06F 3/06* (2006.01)
(Continued)

(52) U.S. Cl.
CPC ............... *G06F 3/061* (2013.01); *G06F 3/064* (2013.01); *G06F 3/0647* (2013.01);
(Continued)

(58) Field of Classification Search
CPC ........... H01L 31/022425; H01L 31/18; H01L 31/0236; Y02E 10/50; Y02E 10/547; H01B 1/22
USPC ........ 257/40, 32, E31.047, E31.124, E31.13
See application file for complete search history.

(56) References Cited

U.S. PATENT DOCUMENTS 5,159,171 A    10/1992  Cook et al.
5,170,990 A    12/1992  Kamiya et al.
(Continued)

FOREIGN PATENT DOCUMENTS

CN    101849281 A    9/2010
CN    201608186 U    10/2010
(Continued)

OTHER PUBLICATIONS

Black Silicon—Wikipedia. http://en.wikipedia.org/wiki/Black_silicon.*

(Continued)

*Primary Examiner* — Chuong A Luu
*Assistant Examiner* — Rodolfo Fortich
(74) *Attorney, Agent, or Firm* — Yuanmin Cai; Hoffman Warnick LLC (57) ABSTRACT

A method for fabricating a photovoltaic device includes applying a diblock copolymer layer on a substrate and removing a first polymer material from the diblock copolymer layer to form a plurality of distributed pores. A pattern forming layer is deposited on a remaining surface of the diblock copolymer layer and in the pores in contact with the substrate. The diblock copolymer layer is lifted off and portions of the pattern forming layer are left in contact with the substrate. The substrate is etched using the pattern forming layer to protect portions of the substrate to form pillars in the substrate such that the pillars provide a radiation absorbing structure in the photovoltaic device.

13 Claims, 7 Drawing Sheets

(51) Int. Cl.

| | |
|---|---|
| *H04W 8/06* | (2009.01) |
| *H01L 31/0236* | (2006.01) |
| *G06F 11/07* | (2006.01) |
| *G06F 12/02* | (2006.01) |
| *H04L 29/08* | (2006.01) |
| *G06F 11/10* | (2006.01) |
| *H04W 8/04* | (2009.01) |

(52) U.S. Cl.
CPC .......... *G06F 3/0653* (2013.01); *G06F 3/0689* (2013.01); *G06F 11/0727* (2013.01); *G06F 12/02* (2013.01); *H01L 31/02366* (2013.01); *H04L 67/1002* (2013.01); *H04W 8/065* (2013.01); *G06F 11/1076* (2013.01); *H04W 8/04* (2013.01); *Y02E 10/50* (2013.01)

(56) References Cited

U.S. PATENT DOCUMENTS

| | | |
|---|---|---|
| 5,175,178 A | 12/1992 | Diana et al. |
| 5,185,178 A | 2/1993 | Koskenmaki et al. |
| 5,366,140 A | 11/1994 | Koskenmaki et al. |
| 5,486,427 A | 1/1996 | Koskenmaki et al. |
| 5,593,901 A | 1/1997 | Oswald et al. |
| 5,977,477 A | 11/1999 | Shiozaki |
| 6,033,928 A | 3/2000 | Eriguchi et al. |
| 6,338,980 B1 | 1/2002 | Satoh |
| 6,350,386 B1 | 2/2002 | Lin |
| 6,417,089 B1 | 7/2002 | Kim et al. |
| 6,593,522 B2 | 7/2003 | Nakano et al. |
| 6,605,772 B2 | 8/2003 | Harman et al. |
| 6,806,141 B2 | 10/2004 | Kamins |
| 7,227,066 B1 | 6/2007 | Roscheisen et al. |
| 7,589,880 B2 | 9/2009 | Kempa et al. |
| 7,605,327 B2 | 10/2009 | Roscheisen et al. |
| 7,634,162 B2 | 12/2009 | Kempa et al. |
| 7,740,713 B2 | 6/2010 | Duchesne et al. |
| 7,883,789 B2 | 2/2011 | Sato et al. |
| 7,923,626 B2 | 4/2011 | Blieske et al. |
| 7,964,499 B2 | 6/2011 | Kim et al. |
| 8,105,860 B2 | 1/2012 | Amiotti |
| 2001/0015221 A1 | 8/2001 | Kubota et al. |
| 2001/0037825 A1 | 11/2001 | Nakano et al. |
| 2002/0117661 A1 | 8/2002 | Kondo et al. |
| 2003/0005956 A1 | 1/2003 | Hirata et al. |
| 2004/0149330 A1 | 8/2004 | Sugiyama et al. |
| 2007/0047056 A1 | 3/2007 | Kempa et al. |
| 2007/0137697 A1 | 6/2007 | Kempa et al. |
| 2007/0176288 A1 | 8/2007 | Daubenspeck et al. |
| 2008/0260941 A1 | 10/2008 | Jin |
| 2008/0265149 A1 | 10/2008 | Endoh et al. |
| 2009/0139571 A1 | 6/2009 | Chen et al. |
| 2009/0194160 A1 | 8/2009 | Chin et al. |
| 2009/0209059 A1* | 8/2009 | Isaka et al. ...................... 438/74 |
| 2009/0261353 A1* | 10/2009 | Gaebler et al. ................. 257/82 |
| 2009/0274873 A1 | 11/2009 | Shinotsuka |
| 2009/0296189 A1 | 12/2009 | Black et al. |
| 2010/0035022 A1 | 2/2010 | Yeh |
| 2010/0051085 A1* | 3/2010 | Weidman .......... H01L 31/02244 136/244 |
| 2010/0071760 A1 | 3/2010 | Kwok et al. |
| 2010/0139771 A1 | 6/2010 | Schwede et al. |
| 2010/0175749 A1 | 7/2010 | Tsutsumi et al. |
| 2010/0200065 A1 | 8/2010 | Choi |
| 2010/0240167 A1 | 9/2010 | Dasgupta et al. |
| 2010/0258163 A1 | 10/2010 | Zheng et al. |
| 2010/0260977 A1 | 10/2010 | Singh et al. |
| 2010/0288329 A1 | 11/2010 | Hong et al. |
| 2010/0319758 A1 | 12/2010 | Ikuno |
| 2011/0121431 A1 | 5/2011 | Cui et al. |
| 2011/0140106 A1* | 6/2011 | Forbes ........................... 257/53 |
| 2011/0146779 A1 | 6/2011 | Chang et al. |
| 2011/0272004 A1 | 11/2011 | Davis et al. |
| 2011/0272014 A1 | 11/2011 | Mathai et al. |
| 2011/0277827 A1 | 11/2011 | Yang et al. |
| 2011/0284061 A1 | 11/2011 | Vanecek et al. |
| 2012/0031454 A1 | 2/2012 | Fogel et al. |
| 2012/0060905 A1* | 3/2012 | Fogel ................ H01L 31/02366 136/255 |
| 2012/0285518 A1 | 11/2012 | De Souza et al. |
| 2012/0318338 A1 | 12/2012 | Fogel et al. |
| 2013/0049150 A1 | 2/2013 | Hong et al. |
| 2013/0049158 A1 | 2/2013 | Hong et al. |
| 2014/0060628 A1 | 3/2014 | Hong et al. |
| 2014/0065752 A1 | 3/2014 | Hong et al. |

FOREIGN PATENT DOCUMENTS

| | | |
|---|---|---|
| JP | 2005197537 A | 7/2005 |
| WO | WO2009082137 A2 | 7/2009 |
| WO | WO 2009100023 A2 * | 8/2009 |
| WO | WO2010065635 A2 | 6/2010 |
| WO | WO2011033464 A1 | 3/2011 |
| WO | WO 2011025733 A1 * | 3/2011 |
| WO | WO 2011047359 A2 * | 4/2011 |

OTHER PUBLICATIONS

Boudouris, "Polythiophene-Containing Block Copolymers for Organic Photovoltaic Applications" Dissertation submitted to the faculty of the Graduate School of the University of Minnesota. Aug. 2009. (290 Pages).

Gorman, M. "Nanocones Make Solar Cells More Efficient, Sinister Looking" May 2011. (1 Page) http://www.engadget.com/2011/05/01/nanocones-make-solar-cells-more-efficient-sinister-looking/.

Hong, A., et al. "Metal Nanodot Memory by Self-Assembled Block Copolymer Lift-Off" Nano Letters, Dec. 2009. pp. 224-229.

Hsu, C., et al. "Wafer-Scale Silicon Nanopillars and Nanocones by Langmuir-Blodgett Assembly and Etching" Applied Physics Letters, vol. 93, Issue 13. Oct. 2008. (3 Pages).

Kim, J., et al. "Three-Dimensional A-Si:H Solar Cells on Glass Nanocone Arrays Patterned by Self-Assembled Sn Nanospheres" ACS Nano. Dec. 2011. [Abstract Only].

Knizilevicius, R. "Simulation of Si and SiO2 Etching in CF4 Plasma" Vacuum, vol. 82, Issue 11. Jun. 2008. pp. 1191-1193.

Krzyzewski, T., et al. "Ripening and Annealing Effects in INAS/GAAS (001) Quantum Dot Formation" Journal of Applied Physics, vol. 96, No. 1. Jul. 2004. (8 Pages).

Patent Cooperation Treaty. "International Search Report and Written Opinion" Issued for PCT International Application No. PCT/US12/40878 on Oct. 15, 2012. (15 Pages).

Patent Cooperation Treaty. "Notification of Transmittal of the International Search Report and the Written Opinion of the International Searching Authority, or the Declaration" Issued for PCT/US2012/052759 on Nov. 13, 2012. (17 Pages).

Stecker, T. "Solar Cell Efficiency Could Be Boosted by Minimizing Defects" May 2011. (2 Pages) http://www.scientificamerican.com/article.cfm?id=boosting-solar-cell-efficciency-minimizing-defects.

Stout, V., et al. "Gettering of Gas by Titanium" Journal of Applied Physics, vol. 26, No. 12. Dec. 1955. pp. 1488-1492.

Zhu, J., et al. "Optical Absorption Enhancement in Amorphous Silicon Nanowire and Nanocone Arrays" Nano Letters. vol. 9, No. 1. Dec. 2008. pp. 279-282.

Fogel, K., et al. (Efficient Nanoscale Solar Cell and Fabrication Method) Non-Final Office Action for U.S. Appl. No. 12/852,991 mailed on Oct. 25, 2012. (16 Pages).

Fogel, K., et al. (Efficient Nanoscale Solar Cell and Fabrication Method) Final Office Action for U.S. Appl. No. 12/852,991 mailed on Feb. 15, 2013. (13 Pages).

Hong, A., et al. (Formation of Metal Nanospheres and Microspheres) Non-Final Office Action for U.S. Appl. No. 13/606,916 mailed on Apr. 2, 2013. (11 Pages).

Fogel, K., et al. (Nanowires Formed by Employing Solder Nanodots) Final Office Action for U.S. Appl. No. 13/599,577 on May 21, 2013. (14 Pages).

Hong, A., et al. (Formation of Metal Nanospheres and Microspheres) Final Office Action for U.S. Appl. No. 13/606,916 mailed on Jul. 17, 2013. (9 Pages).

(56) References Cited

OTHER PUBLICATIONS

Hong, A., et al. (Uniformly Distributed Self-Assembled Solder Dot Formation for High Efficiency Solar Cells) Non-Final Office Action for U.S. Appl. No. 13/611,047 mailed on Jul. 29, 2013. (39 Pages).
Hong, A., et al. (Formation of Metal Nanospheres and Microspheres) Non-Final Office Action for U.S. Appl. No. 13/220,816 mailed on Aug. 1, 2013. (11 Pages).
Fogel, K., et al. (Nanowires Formed by Employing Solder Nanodots) Non-Final Office Action for U.S. Appl. No. 12/879,209 mailed on Aug. 27, 2013. (12 Pages).
Fogel, K., et al. (Efficient Nanoscale Solar Cell and Fabrication Method) Non-Final Office Action for U.S. Appl. No. 12/852,991 mailed on Sep. 16, 2013. (25 Pages).
Fogel, K., et al. (Nanowires Formed by Employing Solder Nanodots) Final Office Action for U.S. Appl. No. 13/599,577 on Sep. 20, 2013. (15 Pages).
Hong, A., et al. (Formation of Metal Nanospheres and Microspheres) Notice of Allowance and Fees Due for U.S. Appl. No. 13/220,816 mailed on Nov. 12, 2013. (11 Pages).
Fogel, K., et al. (Nanowires Formed by Employing Solder Nanodots) Advisory Action for U.S. Appl. No. 13/599,577 on Dec. 17, 2013. (4 Pages).
Fogel, K., et al. (Efficient Nanoscale Solar Cell and Fabrication Method) Non-Final Office Action for U.S. Appl. No. 12/852,991 mailed on Dec. 27, 2013. (18 Pages).
Hong, A., et al. (Uniformly Distributed Self-Assembled Solder Dot Formation for High Efficiency Solar Cells) Final Office Action for U.S. Appl. No. 13/611,047 mailed on Feb. 7, 2014. (38 Pages).
Fogel, K., et al. (Nanowires Formed by Employing Solder Nanodots) Non-Final Office Action for U.S. Appl. No. 13/599,577 on Feb. 12, 2014. (15 Pages).
Hong, A., et al. (Uniformly Distributed Self-Assembled Solder Dot Formation for High Efficiency Solar Cells) Non-Final Office Action for U.S. Appl. No. 13/597,980 mailed on Mar. 19, 2014. (30 Pages).
Fogel, K., et al. (Nanowires Formed by Employing Solder Nanodots) Non-Final Office Action for U.S. Appl. No. 12/879,209 mailed on Mar. 26, 2014. (18 Pages).
Hong, A., et al. (Formation of Metal Nanospheres and Microspheres) Non-Final Office Action for U.S. Appl. No. 13/606,916 mailed on Apr. 2, 2014. (12 Pages).

\* cited by examiner

UNIFORMLY DISTRIBUTED SELF-ASSEMBLED CONE-SHAPED PILLARS FOR HIGH EFFICIENCY SOLAR CELLS

RELATED APPLICATION INFORMATION

This application is related to commonly assigned U.S. patent application Ser. No. 12/852,991 filed on Aug. 9, 2010 and commonly assigned U.S. patent application Ser. No. 12/879,209 filed on Sep. 10, 2010 incorporated herein by reference in its entirety.

This application is a Divisional application of co-pending U.S. patent application Ser. No. 13/161,163 filed on Jun. 15, 2011, incorporated herein by reference in its entirety.

BACKGROUND

1. Technical Field

The present invention relates to photovoltaic devices, and more particularly to devices and methods for improving performance using cone-shaped pillar formation.

2. Description of the Related Art

Solar devices employ photovoltaic cells to generate current flow. Photons in sunlight hit a solar cell or panel and are absorbed by semiconducting materials, such as silicon. Carriers gain energy allowing them to flow through the material to produce electricity. Therefore, the solar cell converts the solar energy into a usable amount of electricity.

When a photon hits a piece of silicon, the photon may be transmitted through the silicon, the photon can reflect off the surface, or the photon can be absorbed by the silicon, if the photon energy is higher than the silicon band gap value. This generates an electron-hole pair and sometimes heat, depending on the band structure.

When a photon is absorbed, its energy is given to a carrier in a crystal lattice. Electrons in the valence band may be excited into the conduction band, where they are free to move within the semiconductor. The bond that the electron(s) were a part of form a hole. These holes can move through the lattice creating mobile electron-hole pairs.

A photon need only have greater energy than that of a band gap to excite an electron from the valence band into the conduction band. Since solar radiation is composed of photons with energies greater than the band gap of silicon, the higher energy photons will be absorbed by the solar cell, with some of the energy (above the band gap) being turned into heat rather than into usable electrical energy.

SUMMARY

A method for fabricating a photovoltaic device includes applying a diblock copolymer layer on a substrate and removing a first polymer material from the diblock copolymer layer to form a plurality of distributed pores. A pattern forming layer is deposited on a remaining surface of the diblock copolymer layer and in the pores in contact with the substrate. The diblock copolymer layer is lifted off and portions of the pattern forming layer are left in contact with the substrate. The substrate is etched using the pattern forming layer to protect portions of the substrate to form pillars in the substrate such that the pillars provide a radiation absorbing structure in the photovoltaic device.

A method for fabricating a photovoltaic device includes forming a dielectric layer on a substrate; forming a solder layer on the dielectric layer; annealing the solder layer to form uniformly distributed solder balls on the dielectric layer; etching the substrate using the solder balls to protect portions of the substrate to form pillars in the substrate such that the pillars provide a radiation absorbing structure in the photovoltaic device; and wet etching the pillars to form cone-shaped structures to be incorporated into the photovoltaic device.

A photovoltaic device includes a substrate including a plurality of uniformly spaced and distributed nano-scale cone-shaped pillars, the cone-shaped pillars including black silicon.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

The present principles provide photovoltaic devices and methods for fabrication that have improved absorption of incident radiation. For high efficiency silicon solar cells, black silicon is a desired material as it maximizes absorption of a light spectrum and minimizes reflection. Black silicon may be formed by etching cone-shaped pillars to form an absorbing surface. In one embodiment, cone formation may include the use of a diblock copolymer to pattern a wafer or substrate, for example, silicon-based substrate, for etching. In another embodiment, a solder or nanodot pattern may be formed for etching the substrate. Glass or other silicon-based substrate materials may be employed for the substrate. Pillars formed in accordance with the present principles may be employed for further forming p-i-n diode layers or other layers for the formation of a photovoltaic cell or cells.

In other embodiments, multi junction cells may be employed to achieve superior carrier collection efficiency. Multi junction cells include two or more cells stacked on top of each other. Any radiation transmitted through a top cell has a chance of being absorbed by a lower cell.

It is to be understood that the present invention will be described in terms of a given illustrative architecture having a wafer; however, other architectures, structures, substrate materials and process features and steps may be varied within the scope of the present invention.

It will also be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Methods as described herein may be used in the fabrication of photovoltaic devices or chips. The resulting device can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Referring now to the drawings in which like numerals represent the same or similar elements and initially to FIGS. 1A-1E, a process form forming cone-shaped pillars on a substrate is illustratively shown. The present process is maskless, low cost and may be performed at low temperatures (e.g., below about 500 degrees C.).

Figure 1A:
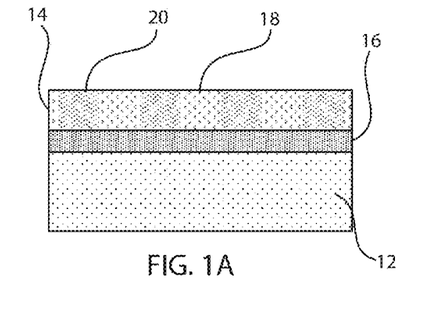
FIG. 1A is a cross-sectional view of a substrate having a diblock copolymer layer and an optional primer film formed thereon in accordance with the present principles.

Referring to FIG. 1A, a substrate 12 may include a silicon material and may include a single (monocrystalline) silicon or a polycrystalline silicon (polysilicon). While other substrate materials may be employed silicon based materials including glass are preferred. In one embodiment, a spincoat diblock copolymer layer 14 is formed on substrate 12 followed by a curing process. Layer 14 may be spun onto the surface in solution and cured for 15 minutes or more at between 160 to 250 degrees C.

In preferred embodiments, the diblock copolymer 14 may include a thin layer (e.g., about 3-7 nm of 58% by weight of polystyrene and 42% by weight of pmma). In preferred embodiments, the diblock copolymer 14 may include a layer, which is about 25-35 nm in thickness and 70% by weight of polystyrene and 30% by weight of pmma. In illustrative embodiments, layer 14 may include a polystyrene/pmma ratio in the range of between 60%-75% for polystyrene and 40%-25% of pmma. Layer 14 may be spun onto the surface in solution and cured for 15 minutes or more at between 160 to 270 degrees C. It should be understood that the pillar density and dimensions can be adjusted in accordance with the composition, thickness and cure times of the layer 14.

One function of the diblock copolymer layer 14 is to render all exposed surfaces neutral to wetting by both constituents of the diblock copolymer. This may be performed by applying an optional primer film 16, such as, e.g., a random copolymer layer, prior to applying the diblock copolymer layer 14. The random copolymer layer 16 may be spun onto the surface of the substrate 12 in a spin coating process in a conformal manner. Under neutral wetting conditions, the pores that form in a diblock copolymer film 14 orient themselves normal to the surface. The random copolymer 16 is not unique in providing this property. Any material which renders the surface neutral to wetting by both diblock components would be suitable as a primer film. The diblock copolymer layer 14 preferably includes two polymer materials including a first polymer component 18 and a second polymer component 20. In one embodiment, the diblock copolymer 14 includes a mixture of polymethylmethacrylate (pmma) (e.g., polymer 18) and polystyrene (e.g., polymer 20). The diblock copolymer 14 may be cured at about 180 degrees C. for about one hour, or until layer 14 is fully cured.

Figure 1B:
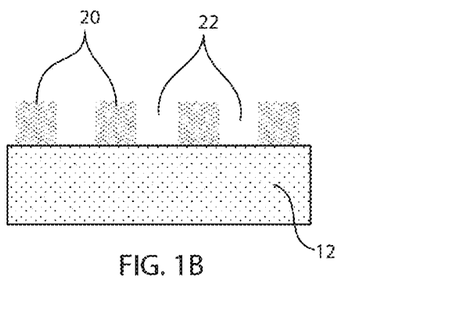
FIG. 1B is a cross-sectional view of the substrate of FIG. 1A having a first polymer of the diblock copolymer layer removed to form pores thereon in accordance with the present principles.

Referring to FIG. 1B, the first polymer component 18 is selectively removed from the substrate 12 leaving the second polymer material 20. The remaining portions of the diblock copolymer 14 (polymer 20) forms a densely packed 2-dimensional array of pores 22. The array of pores 22 includes a substantially uniform density. This means that the cones or pillars (30) which will be formed in later steps will be uniformly distributed on the substrate 12. The pores 22 are formed by treating the layer 14 with a solvent (after curing the diblock copolymer layer 14). The solvent may include, e.g., acetic acid, hydrofluoric acid, hydrochloric acid, formic acid or other suitable solvent. The solvent removes polymer 18 relative to polymer 20 and substrate 12. Any region where the diblock film remains (polymer 20), will possess pores 22 that run perpendicular through the diblock copolymer layer 14 relative to a top surface of the layer 14.

In one illustrative embodiment, the diblock copolymer layer 14 includes, e.g., a polystyrene matrix with locations having pmma in them. Upon treating the layer 14 with the solvent, the pmma is dissolved leaving pores 22 in the polystyrene matrix (polymer 20). The phase separated pmma component in this particular diblock copolymer 14 may be dissolved using acetic acid. Other copolymers may be employed and other solvents may be used. The diblock copolymer layer 14 will now possess an array of densely packed pores 22 oriented normal to the film surface. In one embodiment, the pore diameter is approximately 20 nm with an approximate pitch between pores of about 40 nm, although other sized pores and pitches may be achieved and are effective.

Figure 1C:
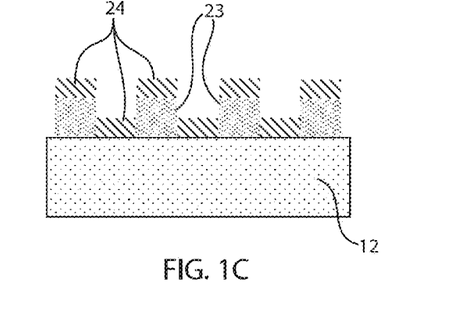
FIG. 1C is a cross-sectional view of the substrate of FIG. 1B having a pattern forming layer formed on a second polymer of the diblock copolymer layer and in the pores in contact with the substrate in accordance with the present principles.

Referring to FIG. 1C, a metal layer 24 is deposited over the remaining portion of the diblock copolymer layer, e.g., the second polymer 20. The metal layer 24 may include Chromium, Tungsten, Copper, Aluminum, Tin, etc. or alloys thereof. In addition, other materials may be employed to form a mask for later etching the substrate 12 as will be described. The metal layer 24 may be deposited by a chemical vapor deposition (CVD), physical vapor deposition (PVD), evaporative deposition, sputtering etc. Other deposition techniques may also be employed.

The metal layer 24 is preferably deposited so that the metal layer covers top portions of the polymer 20 and exposed portions of the substrate 12 within pores 22. It is preferable that portions 23 of sidewalls of pores 22 remain exposed to facilitate removal of the polymer 20 in later steps. The metal layer 24 at the bottom of the pores 22 is distributed in accordance with the array of pores 22 and is therefore substantially uniformly distributed. The formation of the pores 22 and their distribution is achieved without lithographic patterning since the pore array is self-assembled using the diblock copolymer layer 14.

Figure 1D:
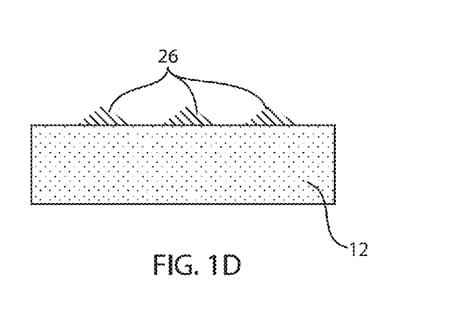
FIG. 1D is a cross-sectional view of the substrate of FIG. 1C showing the pattern forming layer on the substrate in accordance with the present principles.
Figure 1E:
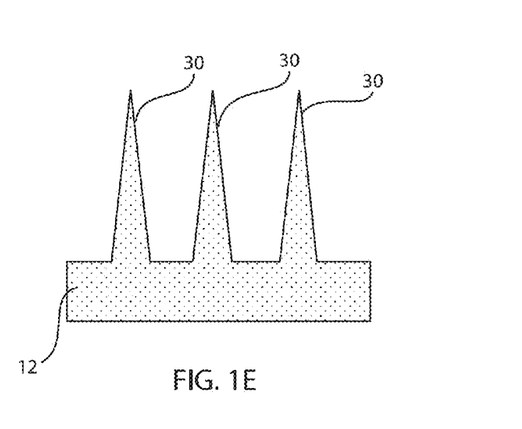
FIG. 1E is a cross-sectional view of the substrate of FIG. 1D showing pillars formed in the substrate in accordance with the present principles.

Referring to FIG. 1D, the polymer 20 is removed from the substrate 12. The polymer 20 may be removed by a lift off process, which may include removing the polymer 20 such that when the polymer 20 is washed away (e.g., in a solvent), the material (metal layer 24) on the top is lifted-off and washed together with the polymer 20 below. After the lift-off, the metal layer 24 remains only in the regions where it had direct contact with the substrate 12, i.e., at the bottom of the pores 22. The pattern 26 of metal layer 24 provides a substantially uniform cone density. This results in accurate and flexible dimension control of pillars 30 (FIG. 1E). The lift-off solvent may include acetone, toluene or Piranha (e.g., a 3:1 mixture of sulfuric acid ($H_2SO_4$) and hydrogen peroxide ($H_2O_2$). Other solvents may also be employed.

Referring to FIG. 1E, an etch process is employed to pattern transfer the pattern 26 into the substrate 12 (e.g., silicon) utilizing a dry etch gas chemistry appropriate for etching substrate 12 with respect to the pattern 26. The dry etch preferably includes a reactive ion etch (RIE) process so that the depth to width ratio is high for pillars or cones 30 formed as a result of the etch process. For Si and/or glass dry etching, tetrafluoromethane ($CF_4$) plasma is preferably employed. During $CF_4$ plasma etching, fluorocarbon deposition occurs which covers the surface during the etching of the substrate 12. The thickness of this fluorocarbon layer varies with substrate material and discharge parameters. The fluorocarbon deposition forms the black silicon. Etch depth may be approximately 1 micron, although other dimensions may be used and are effective. Due to the etching process, the pillars 30 formed include black silicon, which provides absorption benefits if employed for use in photovoltaic cells and in particular solar cells. The black silicon lends itself to high efficiency solar cells using, e.g., substrates including single crystalline silicon (SC-Si) and/or poly or multi-crystalline silicon (MC-Si).

The structure of FIG. 1E may be employed in a silicon-based solar cell and may be stacked on other photovoltaic cells. In one embodiment, the structure of FIG. 1E is employed with a p-i-n stack structure of a photovoltaic device. The pillars 30 assist in increasing the surface area of absorption and provide for radiation trapping between the pillars 30. The pillars 30 with larger than 1:2 (width to height) aspect ratio are preferred for enhanced light absorption and the formation process includes the formation of black silicon on the etched surfaces. Other methods for forming pillars or cones may also be employed. One particularly useful method will be described in accordance with FIGS. 2A-2E.

Figure 2A:
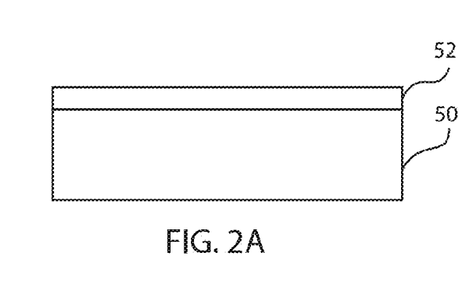
FIG. 2A is a cross-sectional view of a multi-crystalline or single crystalline silicon substrate having a thin dielectric layer formed thereon in accordance with the present principles.

Referring to FIG. 2A, a thin dielectric layer 52 is deposited on a substrate 50. The substrate 50 may include multi-crystalline silicon (MC-Si), single crystalline silicon (SC-Si), amorphous silicon (a-Si), glass or any other suitable material. In one embodiment, the dielectric layer 52 includes a silicon oxide layer. The silicon oxide layer 52 may include a thickness of, e.g., about 50 nm. The dielectric layer 52 may be deposited by a plasma enhanced chemical vapor deposition process or other suitable process.

Figure 2B:
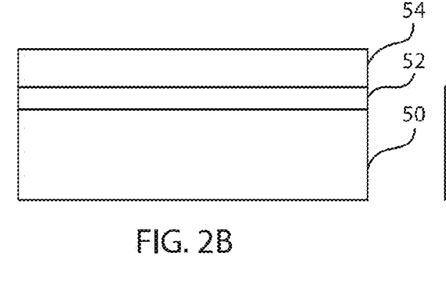
FIG. 2B is a cross-sectional view of the substrate of FIG. 2A having a metal layer deposited on the thin dielectric layer in accordance with the present principles.

Referring to FIG. 2B, a solder metal layer 54 is deposited on the dielectric layer 52. The solder metal layer 54 may include Sn, Pb, Sb, Bi, etc. or combinations thereof. In particularly useful embodiments, Sn solder or solders including Sn are employed. The solder metal layer 54 may include a thickness of between about 20 nm to about 2000 nm, and more preferably around 90 nm. The solder metal layer 54 may be formed by employing a thermal evaporation method.

Figure 2C:
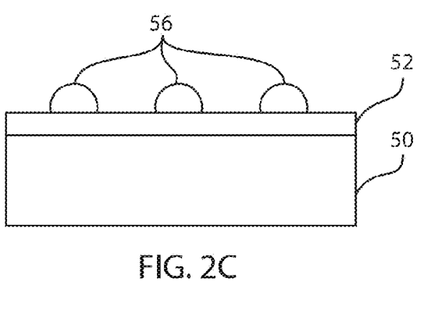
FIG. 2C is a cross-sectional view of the substrate of FIG. 2B after a thermal anneal to form solder balls on the thin dielectric layer in accordance with the present principles.

Referring to FIG. 2C, a rapid thermal anneal (RTA) process is applied to structure such that solder metal layer 54 forms solder balls 56. The solder balls 56 form uniformly (e.g., have a substantially uniform density) based on surface tension effects. The RTA may illustratively include a temperature of between 300 degrees C. to about 400 degrees C. for about 10 seconds. The temperatures and times may vary depending on the solder material and the desired results.

Figure 2D:
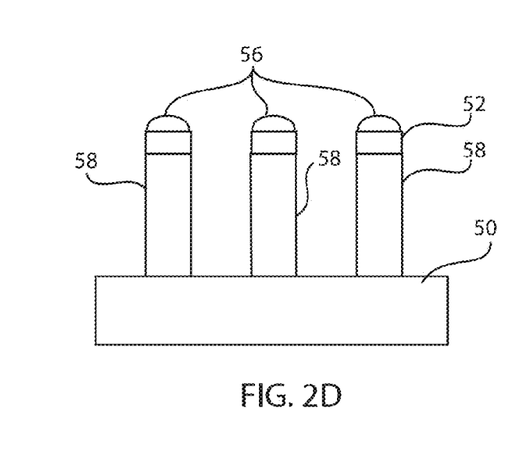
FIG. 2D is a cross-sectional view of the substrate of FIG. 2C showing the solder balls employed as a pattern to etch the substrate in accordance with the present principles.

Referring to FIG. 2D, a dry etch process is employed to etch the dielectric layer 52 and the substrate 50 to form pillars 58. The etch process employs the solder balls 56 as an etch mask. For Si and/or glass dry etching, tetrafluoromethane ($CF_4$) plasma is preferably employed. Reactive ion etching parameters may include, e.g., a 30 minute etch at 300 Watts of power and 100 mTorr. Etch depth may be approximately 1 micron, although other parameters and dimensions may be used and are effective. Due to the etching process, the pillars 58 formed are comprised of black silicon, which provides absorption benefits if employed for use in photovoltaic cells and in particular solar cells. The black silicon lends itself to high efficiency solar cells.

Figure 2E:
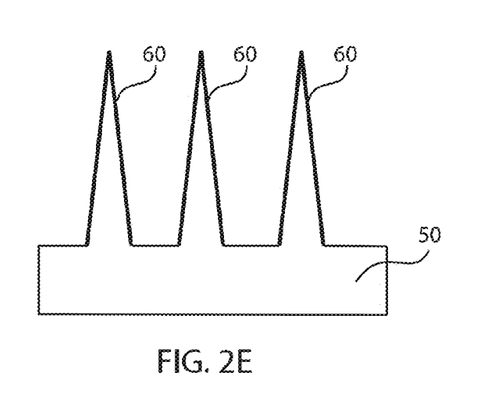
FIG. 2E is a cross-sectional view of the substrate of FIG. 2D showing cone-shaped pillars formed in the substrate in accordance with the present principles.

Referring to FIG. 2E, the solder metal layer 54 and the dielectric layer 52 are removed and the pillars 58 are further etched in a wet etching process. The wet etching process forms tapered conical shapes 60 from the pillars 58. The wet etching process may include a dilute hydrofluoric (HF) etch, e.g., HF:H$_2$O=1:50 for 10-20 minutes for a glass substrate, or a nitric acid (HNO$_3$) and HF etch for Si substrates.

Figure 3A:
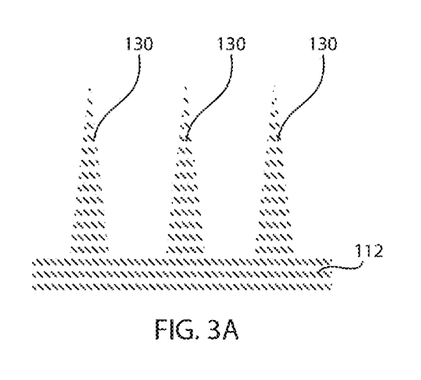
FIG. 3A is a cross-sectional view of a substrate showing pillars/cones formed in a substrate in accordance with the present principles.

Referring to FIGS. 3A-3D and in particular to FIG. 3A, a process of forming an amorphous silicon solar cell is illustratively shown in accordance with another embodiment. It should be understood that a substrate 112 employed in this process includes a transparent material, such as glass; however, silicon or other substrate materials may be employed. In the present case, the substrate 112 has been processed in a same manner as described with respect to FIGS. 1A-1E or FIGS. 2A-2E.

Figure 3B:
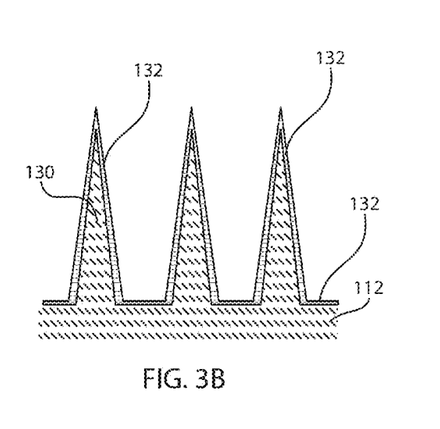
FIG. 3B is a cross-sectional view of the substrate of FIG. 3A showing an electrode layer formed on the pillars in accordance with the present principles.

Referring to FIG. 3B, a first electrode layer 132 is formed on pillars 130 by a deposition process. The first electrode layer 132 may include a transparent conductive material such as a transparent conductive oxide (e.g., zinc oxide, indium tin oxide, indium zinc oxide, etc.), ultra-thin metal (e.g., 20 nm or less in thickness) or other conductive structure. The deposition process may include a chemical vapor deposition process or other suitable deposition process.

Figure 3C:
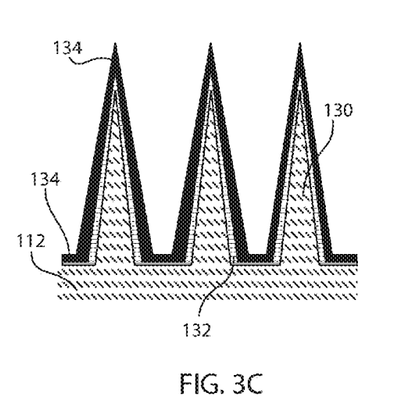
FIG. 3C is a cross-sectional view of the substrate of FIG. 3B showing a pin diode stack formed on the electrode layer in accordance with the present principles.

Referring to FIG. 3C, a p-i-n diode stack 134 is formed over the first electrode 132. The stack 134 preferably includes a first doped layer (p-doped layer), and intrinsic layer (i-layer) and a second doped layer (n-doped layer). The polarity of the doped layers may be reversed. The stack 134 may be formed using a CVD or PECVD process. The stack 134 provides active areas for absorbing radiation and converting the radiation into charge flow as is known in the art. A plurality of different materials may be selected for the layers in stack 134. In one particularly useful embodiment, the first and second doped layers may include doped polycrystalline/microcrystalline silicon and the intrinsic layer may include undoped amorphous silicon.

Figure 3D:
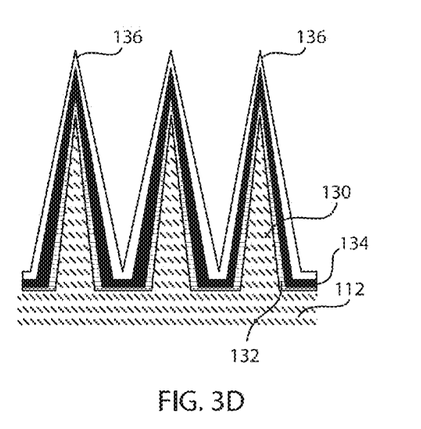
FIG. 3D is a cross-sectional view of the substrate of FIG. 3C showing another electrode formed on the pin stack in accordance with the present principles.

Referring to FIG. 3D, a second electrode 136 is formed on the stack 134. The second electrode 136 may include a transparent conductive material such as a transparent conductive oxide (e.g., zinc oxide, indium tin oxide, indium zinc oxide, etc.), ultra-thin metal (e.g., 20 nm or less in thickness) or other conductive structure. The deposition process may include a CVD, PECVD or other suitable deposition process.

The pillars 130 assist in increasing the surface area of absorption and provide for radiation trapping between the pillars 130. The structures depicted in FIGS. 3A-3D may be constructed to receive light with the pillars 130 facing out (e.g., toward the light) or facing in. The pillars 130 increase the surface area and therefore the collection efficiency in any incident light direction as compared with a flat surface cell.

Figure 4A:
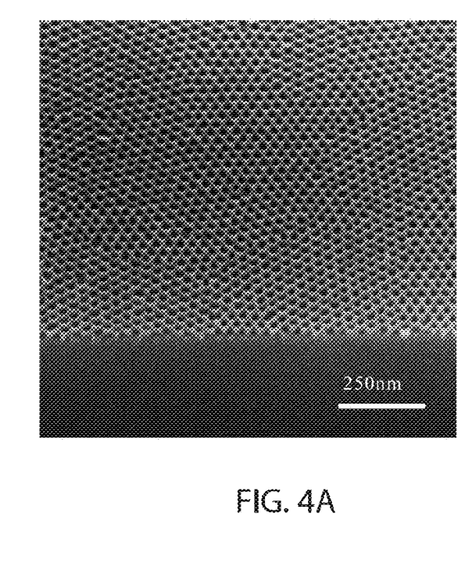
FIG. 4A is a scanning electron microscope image of a diblock copolymer layer with pores in accordance with the present principles.
Figure 4B:
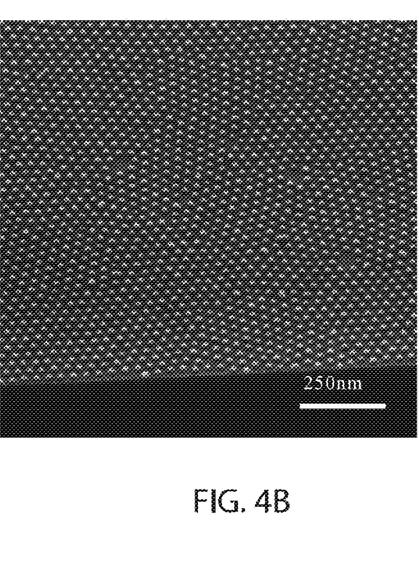
FIG. 4B is a scanning electron microscope image of a pattern forming layer formed using the pores in accordance with the present principles.
Figure 4C:
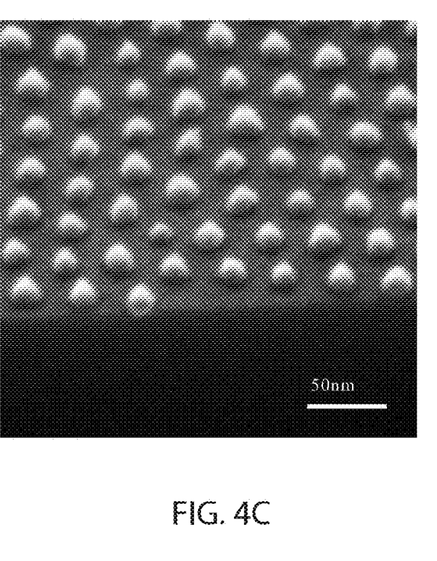
FIG. 4C is a scanning electron microscope image showing a magnified view of FIG. 4B.

Referring to FIGS. 4A-4C, scanning electron microscope images are depicted for the diblock polymer process in accordance with the present principles. FIG. 4A shows an image of a diblock polymer layer with uniformly distributed pores formed therein. Note the scale indicates a length of 250 nm. FIG. 4B is an image of a pattern of a metal layer formed in the pores which will be employed in etching pillars in accordance with the present principles. Note the scale indicates a length of 250 nm. FIG. 4C is a magnified image of the pattern of the metal layer of FIG. 4B. Note the scale indicates a length of 50 nm.

Figure 5:
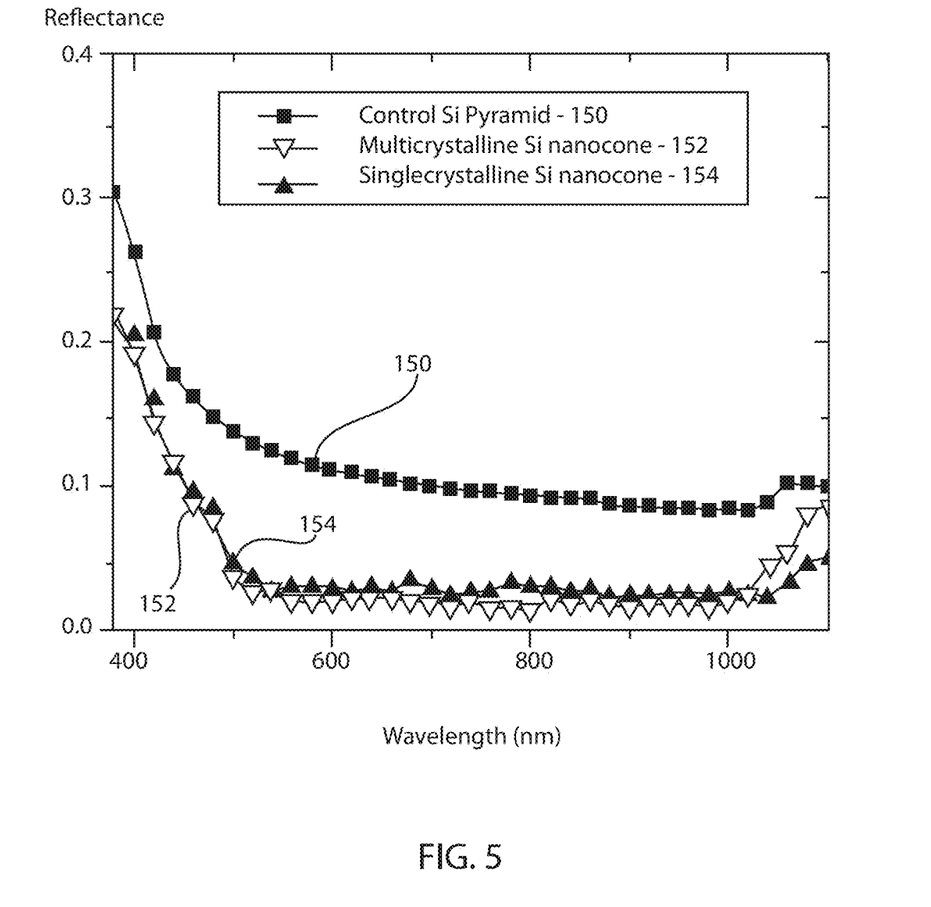
FIG. 5 is a plot of reflectance versus wavelength showing a near-zero reflectance for structures formed in accordance with the present principles.

Referring to FIG. 5, plots of reflectance versus wavelength (nm) are illustratively shown. A plot 150 shows a control silicon pyramid structure over the wavelength range. Plot 152 shows the reflectance of a multi-crystalline silicon substrate with nano-cones formed with black silicon in accordance with the present methods. Plot 154 shows the reflectance of a single-crystalline silicon substrate with nano-cones formed with black silicon in accordance with the present methods. Plots 152 and 154 show a near-zero reflectance using the texturing techniques in accordance with the present principles.

Figure 6:
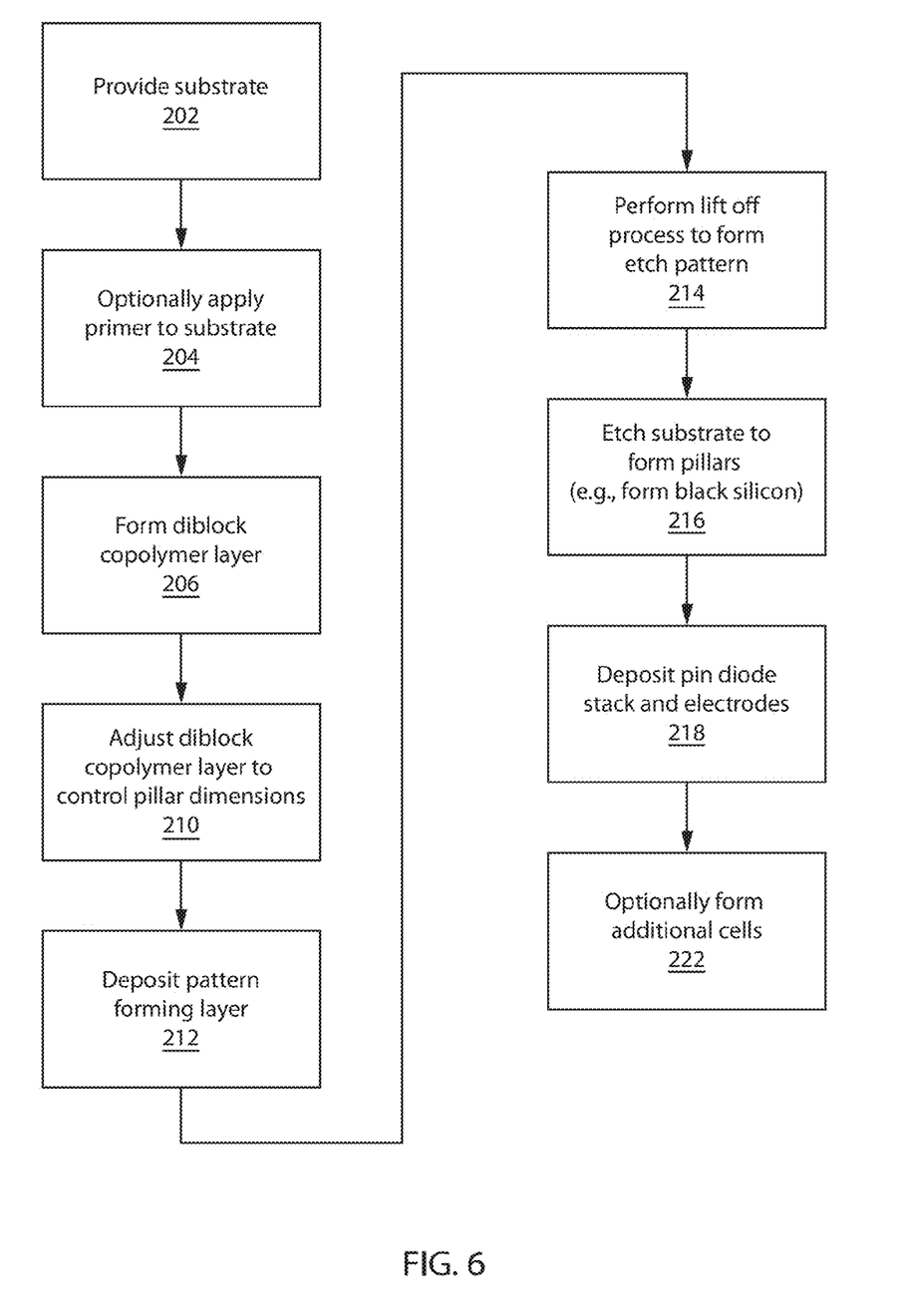
FIG. 6 is a block/flow diagram of a method for fabricating a photovoltaic device in accordance with one illustrative embodiment.

Referring to FIG. 6, a method for fabricating a photovoltaic device is illustratively depicted in accordance with particularly useful embodiments. In block 202, a substrate is provided. The substrate may include materials such as, e.g., single crystalline silicon, multi-crystalline silicon, amorphous silicon, glass, or other etchable materials. In block 204, an optional primer layer may be formed on the substrate before applying a diblock copolymer layer. The primer layer functions as a wetting layer to assist coverage by the diblock copolymer layer. The primer layer may include, e.g., a random copolymer layer. In block 206, a diblock copolymer layer is formed on a substrate. The diblock copolymer layer may be applied using a spinning process. The composition of the diblock copolymer layer may be adjusted to adjust the size and density of the resulting pillar structures as will be described in later steps. The adjustment may include adjusting the composition of the first polymer to the second polymer, adjusting curing times, adjusting the diblock copolymer layer thickness, selecting a primer layer, etc. In block 208, the diblock polymer layer is preferably cured in a low temperature cure process (e.g., about 180 degrees C.).

In block 210, a first polymer material is removed from the diblock copolymer layer to form a plurality of distributed pores. The distribution is substantially uniform such that the pores are equidistant from each other within a matrix. The diblock copolymer layer may include, e.g., polymethylmethacrylate (pmma) and polystyrene and removing a first polymer material may include removing the polymethylmethacrylate (pmma) using a solvent. The solvent may include, e.g., acetic acid.

In block 212, a pattern forming layer is deposited on a remaining surface of the diblock copolymer layer (the matrix) and in the pores in contact with the substrate. The pattern forming layer may include a metal or other material. In block 214, a lifting off process is employed on the diblock copolymer layer and portions of the pattern forming layer to leave portions of the pattern forming layer in contact with the substrate. This forms an etch mask for later forming the pillars. In block 216, the substrate is etched using the pattern forming layer to protect portions of the substrate is performed to form pillars in the substrate such that the pillars provide a radiation absorbing structure in the photovoltaic device. The pillars are preferably cone-shaped. If the substrate includes silicon, the etching process (e.g., reactive ion etching) for forming the pillars preferably results in the formation of black silicon. A CF$_4$ or other suitable plasma is employed to create black silicon on the pillars.

The pillars and substrate may be employed as a layer in a junction structure or as a substrate for forming pin diode structures. In block 218, the pillars have at least one electrode and a diode stack conformally formed on the pillars to provide an active layer for providing current flow responsive to incident radiation. The diode stack may be disposed between two electrodes wherein at least one electrode is transparent. The diode stack includes a p-doped layer, an intrinsic layer and an n-doped layer. The intrinsic layer may include amorphous silicon and the doped layers may include compatible materials.

In block 222, additional photovoltaic cells may be formed on the substrate to create a tandem cell device. The additional cells may be formed on the pillars or on an opposite side of the substrate from the pillars.

Figure 7:
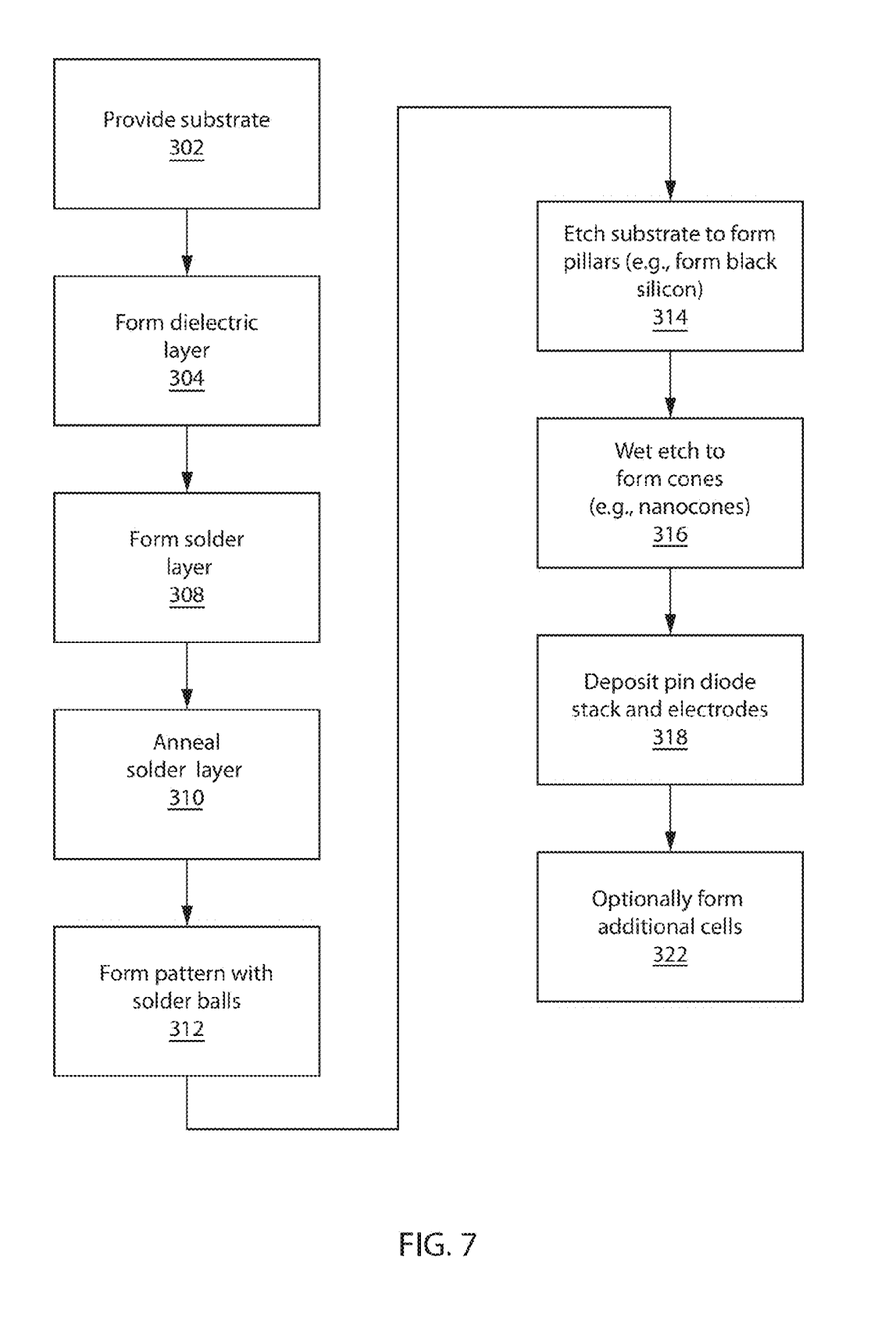
FIG. 7 is a block/flow diagram of another method for fabricating a photovoltaic device in accordance with one illustrative embodiment.

Referring to FIG. 7, another method for fabricating a photovoltaic device is illustratively depicted in accordance with particularly useful embodiments. In block 302, a substrate is provided. The substrate may include materials such as, e.g., single crystalline silicon, multi-crystalline silicon, amorphous silicon, glass, or other etchable materials. In block 304, a dielectric layer may be formed on the substrate (e.g., silicon dioxide). In block 308, a solder layer is formed on the dielectric layer and preferably includes Sn although other materials may be employed.

In block 310, the solder layer is annealed, e.g., using a RTA, to form solder balls. In block 312, the solder balls form a pattern for etching the substrate to form pillars. The size and density of the solder balls may be controlled by the thickness of the solder layer, the temperature of the anneal, the duration of the anneal, etc.

In block 314, the substrate is etched (e.g., with $CF_4$ plasma or other suitable plasma) using the pattern to protect portions of the substrate to form pillars in the substrate. If the substrate includes silicon, the etching process (e.g., reactive ion etching) for forming the pillars preferably results in the formation of black silicon. In block 316, the pillars are etched in a wet etch process such that the pillars provide a radiation absorbing structure in the photovoltaic device. The pillars preferably become cone-shaped.

The pillars and substrate may be employed as a doped layer in a solar cell structure or as a substrate for forming pin diode structures. In block 318, the pillars have at least one electrode and a diode stack conformally formed on the pillars to provide an active layer for providing current flow responsive to incident radiation. The diode stack may be disposed between two electrodes wherein at least one electrode is transparent. The diode stack includes a p-doped layer, an intrinsic layer and an n-doped layer. The intrinsic layer may include amorphous silicon and the doped layers may include compatible materials.

In block 322, additional photovoltaic cells may be formed on the substrate to create a tandem cell device. The additional cells may be formed on the pillars or on an opposite side of the substrate from the pillars.

Having described preferred embodiments of a system and method for uniformly distributed self-assembled cone-shaped pillars for high efficiency solar cells (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for fabricating a photovoltaic device, comprising: forming a dielectric layer on a substrate, wherein the substrate includes a silicon including material;
   forming a solder layer on the dielectric layer;
   annealing the solder layer to form uniformly distributed solder balls on the dielectric layer;
   etching the substrate using the solder balls to protect portions of the substrate to form pillars in the substrate such that the pillars provide a radiation absorbing structure in the photovoltaic device, wherein the etching of the substrate comprises using a carbon containing plasma and no $O_2$, the etching using a carbon containing plasma and no $O_2$ being to convert the pillars to black silicon, wherein the carbon containing plasma is employed to increase absorption of light spectra and reduce reflectance of the pillars containing the black silicon in comparison to the silicon including material of the substrate without carbon from the carbon containing plasma; and
   wet etching the pillars to form cone-shaped structures to be incorporated into the photovoltaic device.

2. The method as recited in claim 1, wherein the solder layer includes Sn.

3. The method as recited in claim 1, further comprising conformally forming at least one electrode and a diode stack on the cone-shaped structures to provide an active layer for providing current flow responsive to incident radiation.

4. The method as recited in claim 1, wherein the solder layer includes a thickness of between about 20 nm and 2000 nm.

5. The method as recited in claim 1, wherein annealing includes a rapid thermal anneal.

6. The method as recited in claim 1, wherein the substrate includes monocrystalline silicon, polycrystalline silicon or a combination thereof, and etching the substrate includes performing a reactive ion etch.

7. The method as recited in claim 1, wherein etching the substrate includes performing a reactive ion etch with $CF_4$ plasma.

8. The method as recited in claim 1, wherein the substrate includes a glass, and etching the substrate includes performing a reactive ion etch.

9. The method as recited in claim 1, wherein the diode stack is disposed between two electrodes wherein at least one electrode is transparent, the diode stack including a p-doped layer, an intrinsic layer and an n-doped layer.

10. The method as recited in claim 9, wherein the intrinsic layer includes amorphous silicon.

11. The method as recited in claim 1, further comprising controlling dimensions and density of the pillars by adjusting parameters of said annealing and adjusting a thickness of the solder layer.

12. A method for fabricating a photovoltaic device, comprising: forming a dielectric layer on a substrate, wherein the substrate includes a silicon including material;
   forming a solder layer on the dielectric layer;
   annealing the solder layer at a range of about 300 degrees Celsius to about 400 degrees Celsius to form uniformly distributed solder balls on the dielectric layer;
   etching the substrate using the solder balls to protect portions of the substrate to form pillars in the substrate such that the pillars provide a radiation absorbing structure in the photovoltaic device, wherein the etching of the substrate comprises using a carbon containing plasma to convert the pillars to black silicon, wherein the carbon containing plasma is employed to increase absorption of light spectra and reduce reflectance of the pillars containing the black silicon in comparison to the silicon including material of the substrate without carbon from the carbon containing plasma; and
   wet etching the pillars to form cone-shaped structures to be incorporated into the photovoltaic device.

13. The method as recited in claim 12, wherein the annealing in the range of about 300 degrees Celsius to about 400 degrees Celsius occurs for about 10 seconds.

* * * * *